US007763819B2

(12) United States Patent
Ieda et al.

(10) Patent No.: US 7,763,819 B2
(45) Date of Patent: Jul. 27, 2010

(54) SWITCH DEVICE

(75) Inventors: Kiyokazu Ieda, Chiryu (JP); Hideo Haneda, Chiryu (JP); Takeshi Ito, Chiryu (JP)

(73) Assignee: Aisin Seiki Kabushiki Kaisha, Kariya-Shi, Aichi (JP)

( * ) Notice: Subject to any disclaimer, the term of this patent is extended or adjusted under 35 U.S.C. 154(b) by 871 days.

(21) Appl. No.: 11/630,285

(22) PCT Filed: Jun. 21, 2005

(86) PCT No.: PCT/JP2005/011313

§ 371 (c)(1), (2), (4) Date: Dec. 20, 2006

(87) PCT Pub. No.: WO2005/124806

PCT Pub. Date: Dec. 29, 2005

(65) Prior Publication Data

US 2008/0067050 A1 Mar. 20, 2008

(30) Foreign Application Priority Data

Jun. 22, 2004 (JP) ............................ 2004-183665

(51) Int. Cl.
*H03K 17/975* (2006.01)

(52) U.S. Cl. ...................................................... 200/600

(58) Field of Classification Search ................. 200/600; 361/288, 290, 291

See application file for complete search history.

(56) References Cited

U.S. PATENT DOCUMENTS 2,262,777 A 11/1941 Roper
3,710,209 A * 1/1973 Webb et al. ................. 200/600
3,751,612 A 8/1973 Hansen (Continued)

FOREIGN PATENT DOCUMENTS

JP 57-99326 12/1955

(Continued)

OTHER PUBLICATIONS

Official Action issued in corres. CN Patent Application No. 200580011717 5, Nov. 7, 2008, The Intellectual Property Office of the People's Republic of China, CN; and English-language translation thereof.

(Continued)

*Primary Examiner*—Ross N Gushi
(74) *Attorney, Agent, or Firm*—Buchanan Ingersoll & Rooney PC

(57) ABSTRACT

As sensor means for sensing an operation input of a user, a switch device X comprises a first electrode 11 that is an elastic plate member, and a second electrode 12 that is opposed to the first electrode 11. The first electrode 11 is provided so as to be switchable between a first stable posture in which the first electrode is biased to a switch input cancellation position and a second stable posture in which the first electrode is biased to a switch input position. An operation member 17 is provided for applying an operation force to the first electrode 11, thereby returning the posture thereof from the second stable posture to the first stable posture after the posture has been changed from the first stable posture to the second stable posture.

10 Claims, 3 Drawing Sheets

U.S. PATENT DOCUMENTS

| | | | | | |
|---|---|---|---|---|---|
| 4,417,294 | A * | 11/1983 | Herron, Jr. | .................. | 361/288 |
| 7,057,124 | B2 | 6/2006 | Ieda et al. | | |
| 7,091,823 | B2 | 8/2006 | Ieda et al. | | |

FOREIGN PATENT DOCUMENTS

| | | | |
|---|---|---|---|
| JP | 51-28471 | | 3/1976 |
| JP | 51-28471 | U | 3/1976 |
| JP | 51-144972 | | 12/1976 |
| JP | 55-96516 | | 7/1980 |
| JP | 55-96516 | A | 7/1980 |
| JP | 59-25131 | U | 2/1984 |
| JP | 3-69594 | | 3/1991 |
| JP | 3-101819 | U | 10/1991 |
| JP | 4-24580 | | 1/1992 |
| JP | 4-24580 | Y2 | 6/1992 |
| JP | 3069594 | U | 6/2000 |
| JP | 2001-148726 | A | 5/2001 |
| JP | 2001-297657 | A | 10/2001 |
| JP | 2002-190229 | A | 7/2002 |
| JP | 2003-047797 | A | 2/2003 |
| JP | 2003-051227 | A | 2/2003 |
| JP | 2003-347757 | A | 12/2003 |
| JP | 3480276 | B2 | 12/2003 |

OTHER PUBLICATIONS

Official Action issued in priority JP Patent Application No. 2004-183665, Nov. 6, 2008, The Japanese Patent Office, JP; and English-language translation thereof.

Official Action issued by the Japanese Patent Office in corresponding JP Patent Application No. 2004183665, Dec. 6, 2007.

Official Action issued in corresponding JP 2004-183665, Feb. 28, 2008, JPO; and an English-language discussion of contents of Official Action.

English version of International Search Report dated Aug. 18, 2005.

European Search Report dated Jun. 28, 2007.

* cited by examiner (a)

(b)

SWITCH DEVICE

TECHNICAL FIELD

The present invention relates to switch devices, and mainly to door lock switches and the like on a door handle of a vehicle.

BACKGROUND ART

In conventional switch devices that perform a switch operation of switching on/off of information based on a pressing-down operation by a user, the switch operation is performed by utilizing a reaction force against the pressing-down operation with, for example, an elastic sheet-like rubber plate (Patent Document 1, for example) and a sheet with a swollen portion (Patent Document 2, for example).

For example, the switch device disclosed in Patent Document 1 is provided with a switch having a metal plate contact point that is protruded via an elastic member such as synthetic rubber. The switch has a configuration in which when a corresponding key button directly above the elastic member is pressed down in a switch operation, the metal plate contact point is flattened, thereby turning the switch on, for example. On the other hand, when the pressing-down force on the key button is removed, a restoring force of the elastic member and the metal plate contact point returns the metal plate contact point to its original shape, thereby turning the switch off, for example.

Furthermore, the switch device disclosed in Patent Document 2 has a configuration in which when a swollen portion provided on a sheet is pressed with a finger of a user in a switch operation, the swollen portion is dented downward, and a head portion of a switch group disposed therebelow is pressed downward, thereby turning the switch on.

In addition to the above-described switch devices in which a pressing-down operation is necessary in a switch operation, a so-called touch-switch is known in which when contact with a user is detected, the switch operation is performed (Patent Document 3, for example).

More specifically, in the touch switch disclosed in Patent Document 3, the contact of a user with a touch panel is detected when the capacitance of a touch detection electrode changes and reaches a predetermined threshold value or less, or the capacitance that is a predetermined threshold value or less is kept for a predetermined time or more.

Patent Document 1: JP 2003-347757A (see paragraphs 0026 to 0029, for example)

Patent Document 2: JP 2003-47797A (see paragraph 0018, for example)

Patent Document 3: Japanese Patent No. 3480276 (see paragraphs 0002 to 0006, for example)

DISCLOSURE OF THE INVENTION

Problem to be Solved by the Invention

As described above, in a case where a switch operation is performed based on a pressing-down operation, the switch is turned on, when an elastic member or a key button is pressed down with a finger so that a metal plate contact point is pressed down (Patent Document 1), or when a swollen portion provided on a sheet is pressed with a finger so that the swollen portion is dented downward and thus a head portion of a switch group disposed therebelow is pressed down (Patent Document 2).

In this case, when the key button or the swollen portion that is a contact point between a finger and the switch device is pressed down with a finger, it is difficult for the user to reliably confirm a strength of pressing-down force and a length of pressing-down distance (stroke) that are necessary to complete the switch operation of switching on/off of information. In other words, there is a problem in that it is difficult for a user to reliably feel the completion of the switch operation.

Accordingly, in order to reliably perform a switch operation, it is necessary to perform an operation that is not actually necessary, such as a pressing-down operation with a force stronger than a pressing-down force that is actually necessary for the switch operation and for a time longer than a time that is actually necessary for the switch operation. Furthermore, it is recognized that the switch operation has been properly performed, by visually confirming, for example, that the door has been completely locked or the light has been completely turned on as expected after the completion of the switch operation.

Herein, the switch device may be installed as a door lock switch on a door handle of a vehicle at a location in a poor environment, such as the outdoors, in darkness or exposed to wind and rain. In this case, it is possible to eliminate the necessity of visual confirmation, if at the moment of a switch operation, the completion of the switch operation can be felt with a finger or the like.

On the other hand, in the touch switch described in Patent Document 3, a switch operation is completed when a user lightly touches a touch panel. However, the switch is operated also when the user unintentionally brings a part of body into contact with the touch panel or when a rain droplet is in contact with the touch panel installed outdoors, for example. Accordingly, depending on the installation location of a switch device or the installation purpose such as being used for locking a door, a configuration is preferable in which a pressing-down stroke of a predetermined level is performed, and in which the completion of the switch operation can be felt.

Thus, it is an object of the present invention to provide a switch device in which the completion of a switch operation can be reliably recognized when a pressing-down stroke of a predetermined level has been performed, and in which a malfunction can be prevented from occurring even when it is installed in a poor environment such as the outdoors.

Means for Solving Problem

In order to achieve the object, a first feature of the present invention is directed to a switch device, comprising a first electrode that is an elastic plate member, and a second electrode that is opposed to the first electrode, as sensor means for sensing an operation input of a user, wherein the first electrode is provided so as to be switchable between a first stable posture in which the first electrode is biased to a switch input cancellation position and a second stable posture in which the first electrode is biased to a switch input position, and wherein an operation member is provided for applying an operation force to the first electrode, thereby returning the posture thereof from the second stable posture to the first stable posture after the posture has been changed from the first stable posture to the second stable posture.

At the switch input cancellation position, that is, in the first stable posture in a wait state for a switch operation of the user, the first electrode is in a stable posture in which the first electrode is biased to a side opposite to the second electrode that is opposed to the first electrode. Furthermore, at the switch input position, that is, in the second stable posture after the user has performed a switch operation, the first electrode is in a stable posture in which the first electrode is biased toward the second electrode that is opposed to the first electrode.

Furthermore, according to the first feature, the first electrode is configured so as to be switchable between the first stable posture and the second stable posture. Accordingly, when the posture is changed from the protruding first stable posture to the recessed second stable posture, for example, a shock caused when the plate member is elastically deformed, that is, a shock caused when the shape of the plate member is shifted from a protruding shape to a recessed shape can be felt by the user as a click feel.

Herein, in the switch operation, after the posture has been changed from the first stable posture to the second stable posture, the first electrode is in the second stable posture in which the first electrode is biased to the switch input position. In this state, the switch is kept in the posture of the input position, and thus it is necessary to return the posture to the first stable posture.

More specifically, in the present configuration, an operation member is provided for applying an operation force to the first electrode, thereby returning the posture thereof from the second stable posture to the first stable posture after the posture has been changed from the first stable posture to the second stable posture. In this manner, it is possible to return a posture from the second stable posture to the first stable posture by applying an operation force to the first electrode. Also in this case, a shock caused when the plate member is elastically deformed can be felt by the user as a click feel as described above.

Furthermore, immediately after the switch operation, the first electrode can return to the input cancellation position in a wait state for a switch operation, and thus a next input operation of the switch can be promptly performed.

Thus, according to the switch device described in the first feature of the present invention, the user can feel as a click feel that a switch operation has been performed. Thus, it is possible to reliably recognize the completion of the switch operation, and it is not necessary for the user to visually confirm the completion of the switch operation.

Furthermore, since the posture is changed from the first stable posture to the second stable posture, it is possible to recognize the completion of the switch operation when a pressing-down stroke of a predetermined level has been performed. Thus, it is not necessary to perform a switch operation with a force stronger than a pressing-down force that is actually necessary for the switch operation. Accordingly, it is possible to provide a switch device that can perform a switch operation with a small pressing-down force and that can promptly perform a next input operation of the switch.

Furthermore, since the posture is changed from the first stable posture to the second stable posture, it is necessary to perform a pressing-down stroke of a predetermined level. Thus, a malfunction can be prevented from occurring in which a switch is operated by the user unintentionally being in contact with the switch, for example.

A second feature of the present invention is directed to the switch device wherein the sensor means is of a capacitance-type for detecting a change in a capacitance between the first electrode and the second electrode.

According to the second feature, whether or not a switch operation has been performed can be detected by converting a change in the capacitance into a change in the voltage in a circuit when the posture of the first electrode is changed from the first stable posture to the second stable posture.

More specifically, a configuration is provided in which a switch operates upon detecting a change in the capacitance when the posture of the first electrode is changed from the first stable posture to the second stable posture in a switch operation, and at the same time, the user can feel a click feel when the posture is changed. Accordingly, the configuration of a known capacitance detection sensor can be preferably applied to the present configuration, and thus the sensor means can be produced easily and at a low cost.

A third feature of the present invention is directed to the switch device wherein the sensor means is of a piezoelectric-type for detecting a change in a pressure of the first electrode on the second electrode.

According to the third feature, the first electrode is in contact with the second electrode when the posture of the first electrode is changed from the first stable posture to the second stable posture, and whether or not a switch operation has been performed can be detected by detecting a change in the pressure of the first electrode on the second electrode at this time as a change in the voltage of the piezoelectric element.

More specifically, a configuration is provided in which a switch operates upon detecting a change in the voltage of the piezoelectric element when the posture of the first electrode is changed from the first stable posture to the second stable posture in a switch operation, and at the same time, the user can feel a click feel when the posture is changed. Accordingly, the configuration of a known piezoelectric-type sensor can be preferably applied to the present configuration, and thus the sensor means can be produced easily and at a low cost.

A fourth feature of the present invention is directed to the switch device wherein an internal portion of the sensor means is sealed.

With this sealing, the internal portion of the sensor means is configured so as to be airtight and watertight from the outside, for example, using a sealing member, or by pressure-bonding a plurality of components forming the external shape of the sensor means.

Thus, according to the switch device described in the fourth feature of the present invention, a rain droplet, dust, or the like hardly enters the internal portion of the sensor means even in a poor environment, such as the outdoors, exposed to wind and rain. Accordingly, even in such an environment, there is almost no risk of affecting the first or the second electrode in a negative manner, so that it is expected that a switch operation is reliably performed.

A fifth feature of the present invention is directed to the switch device further comprising an electrode support member for supporting the first electrode and the second electrode such that the first electrode and the second electrode are opposed to each other, wherein the first electrode is supported in a curved manner with respect to the electrode support member.

According to the fifth feature, the first electrode is supported in a curved manner with respect to the electrode support member.

Thus, for example, the first electrode can be configured so as to be switchable between a protruding first stable posture and a recessed second stable posture by fixing the end portions of the first electrode with the electrode support member. Accordingly, it is not necessary to move the first electrode when changing the posture thereof, and thus it is possible to provide a compact switch device.

A sixth feature of the present invention is directed to the switch device wherein the first electrode is constituted by a plate spring, and is switchable between a protruding first stable posture and a recessed second stable posture with respect to the second electrode.

More specifically, the first electrode is constituted by a plate spring, and is configured so as to be switchable between the first stable posture and the second stable posture simply by changing the shape of the plate spring from a protruding shape to a recessed shape or in a reverse manner, without using an additional component.

Accordingly, a known plate spring can be preferably applied to the present configuration, and the number of components can be reduced, and thus the switch device can be produced easily and at a low cost.

A seventh feature of the present invention is directed to the switch device wherein a shock is applied to the operation member when the posture of the first electrode is changed from the first stable posture to the second stable posture.

For example, when an operation member is pressed down by a key button and thus the posture of the first electrode is changed to the second stable posture through the operation member, a shock applied to the operation member when the posture is changed is efficiently transmitted to the key button.

Thus, it is possible to more reliably feel as a click feel that a switch operation has been performed, and thus it is possible to realizably recognize the completion of the switch operation.

An eighth feature of the present invention is directed to the switch device wherein a surface of the second electrode is covered with a dielectric protective film.

When the surface of the second electrode is covered with a dielectric protective film as in the eighth feature, the surface of the second electrode can be effectively protected and a good electric insulation performance can be secured.

A ninth feature of the present invention is directed to the switch device wherein the first electrode is not in contact with the second electrode even when the posture is changed from the first stable posture to the second stable posture.

When the first electrode is configured so as not to be in contact with the second electrode even when the posture thereof is shifted to the second stable posture as in the ninth feature, a pressing-down stroke can be shortened, and thus a switch operation can be performed with a pressing-down force smaller than that in conventional examples.

In particular, when the sensor means is of a capacitance-type for detecting a change in a capacitance between the first electrode and the second electrode, the electrodes are configured so as not to be in contact with each other as in the present configuration, in order to detect the capacitance.

A tenth feature of the present invention is directed to the switch device wherein the operation member is provided at a center of the first electrode.

When the operation member is provided at a center of the first electrode as in the tenth feature, an operation force for returning the first electrode from the second stable posture to the first stable posture can be efficiently applied from the operation member to the first electrode.

Accordingly, the first electrode can return from the second stable posture to the first stable posture with a smaller operation force.

BEST MODE FOR CARRYING OUT THE INVENTION

Hereinafter, embodiments of the present invention are described based on the drawings.

The switch device according to the present invention can reliably perform a switch operation even in a poor environment, and thus it can be used as a lock switch that is provided on a door handle disposed on the outer side of a vehicle door, but there is no limitation to this. Other embodiments include various switch devices such as switches of measuring instruments in the outdoors, or switches inside plants or the like in which even in the indoors, generation of particle dusts and high humidity are expected.

Hereinafter, a case is described in which the switch device according to the present invention has been applied to a lock switch.

As shown in FIGS. 1 and 2, a switch device X according to the present invention is provided on a door handle 1 that is disposed on the outer side of a vehicle door 10.

The door handle 1 is constituted by items such as a handle unit 2 that is provided with an arm 4 on the front side on the vehicle body, and a handle cover 3 that covers the handle unit 2. The handle unit 2 and the handle cover 3 are made of a synthetic resin.

In addition to the switch device X, the internal portion of the door handle 1 includes items such as a door unlock sensor 5 for unlocking the door upon recognizing a user approaching, a wire harness 6 for connecting with a discrimination circuit for discriminating whether or not human body is approaching, based on a signal from the door unlock sensor 5, and an antenna 7 for communicating with a remote controller that is carried by a user.

FIG. 3 shows a detailed view of the switch device X.

As sensor means for sensing an operation input of a user, the switch device X has a first electrode 11 that is an elastic plate member, and a second electrode 12 that is opposed to the first electrode.

Furthermore, the switch device X has a key button 13, switch device sealing portions 14*a* and 14*b*, an electrode support portion 15, and a switch device external wall portion 16.

The switch device sealing portion 14*a* is constituted by an elastic material such as rubber so that the posture of the first electrode 11 can be changed toward the second electrode 12 when the user presses down the key button 13.

Furthermore, the internal portion of the sensor means is sealed by pressure-bonding the switch device sealing portion 14*a* and the switch device sealing portion 14*b*. Thus, a rain droplet, dust, or the like hardly enters the sensor means inside the switch device X even in a poor environment exposed to wind and rain. In this manner, in this embodiment, it is possible to keep a highly sealed state of the sensor means by pressure-bonding a plurality of components (the switch device sealing portions 14*a* and 14*b*) forming the external shape of the sensor means.

It should be noted that there is no specific limitation regarding the shape of the switch device X, and various shapes can be applied such as a quadratic prism and a cylinder.

There is no specific limitation regarding the first electrode 11 as long as it is an elastic plate member, and it is possible to apply a known metal (such as copper) plate spring, for example. In this case, surface treatment such as rustproofing for preventing corrosion can be applied to the surface of the plate spring.

The plate-shaped first electrode 11 is provided so as to be switchable between a first stable posture in which the first electrode 11 is biased to a switch input cancellation position and a second stable posture in which the first electrode 11 is biased to a switch input position. For example, a configuration is preferable in which a protruding first stable posture that protrudes toward the user and a recessed second stable posture are provided.

In this case, at the switch input cancellation position, that is, in the first stable posture in a wait state for a switch operation of the user, the first electrode 11 is in a stable posture in which the first electrode 11 is biased to a side opposite to the second electrode 12 that is opposed to the first electrode 11 (see FIG. 3(*a*)).

Furthermore, at the switch input position, that is, in the second stable posture after the user has performed a switch operation, the first electrode 11 is in a stable posture in which the first electrode 11 is biased toward the second electrode 12 that is opposed to the first electrode 11 (see FIG. 3(*b*)).

Herein, the diameter of the first electrode 11 in both the protruding first stable posture and the recessed second stable posture is set to be smaller than the inner diameter of a space for holding the first electrode 11 in the electrode support member 15 such that the first electrode 11 can be elastically deformed easily between the postures.

In this case, when the first electrode 11 that is constituted by a material such as a plate spring is pressed down with a force of a predetermined load or more, the posture can be changed from the protruding first stable posture to the recessed second stable posture. The term "predetermined load" refers to, for example, a load applied when the user performs a pressing-down operation with a normal force suitable for intentionally performing a switch operation, and does not refer to a small load applied, for example, when the user unintentionally brings a part of body into contact with the switch.

Since the first electrode 11 is configured so as to be switchable between the first stable posture and the second stable posture, when the posture is changed from the protruding first stable posture to the recessed second stable posture, for example, a shock caused when the plate member is elastically deformed, that is, a shock caused when the shape of the plate member is shifted from a protruding shape to a recessed shape can be felt by the user as a click feel.

In this case, if the sensor means is configured so as to be of a capacitance-type for detecting a change in the capacitance between the first electrode 11 and the second electrode 12, then a configuration can be obtained in which whether or not a switch operation has been performed can be detected by converting a change in the capacitance into a change in the voltage in a detection circuit (out of the drawings) when the posture is changed from the first stable posture to the second stable posture. The detection circuit is connected via a signal wire 18 to the second electrode 12.

The following is a detailed description concerning this capacitance-type sensor means.

More specifically, the second electrode 12 serves as a sensor electrode, and the capacitance is generated between the second electrode 12 and the first electrode 11 that is constituted by a plate spring. It should be noted that as the second electrode 12, it is possible to apply materials such as a metal plate and a conductive plate that are known sensor electrodes. In this case, the surface of the second electrode 12 may be covered with a dielectric protective film.

Herein, the capacitance C is expressed by a formula $C=\in\gamma\cdot S/d$ ($\in\gamma$: dielectric constant, S: surface area of electrode, d: distance between electrodes). More specifically, since the dielectric constant ($\in\gamma$) and the surface area (S) of the electrode are constant, the capacitance C changes depending on a change in the distance between the electrodes. The change in the capacitance C can be detected with the detection circuit.

When the posture of the first electrode 11 is changed from the first stable posture to the second stable posture due to a switch operation, the distance (d) between the first electrode 11 and the second electrode 12 changes. Accordingly, the capacitance C changes, and the switch operates upon detecting the change in the capacitance.

Furthermore, when the switch operation is performed in this manner, as described above, the user can feel a click feel accompanying a change in the posture, and can reliably recognize that the door has been completely locked.

When the first electrode 11 and the second electrode 12 are applied as a door lock switch device of a vehicle as in this embodiment, the size thereof is such that the diameter is approximately 9 mm±0.5 mm and the thickness is approximately 0.06 to 0.08 mm. In this case, if a configuration is applied in which an amount of the first electrode 11 displaced from the first stable posture to the second stable posture is approximately 0.4 mm, then the posture of the first electrode 11 can be changed from the first stable posture to the second stable posture with a load applied when the user performs a pressing-down operation with a normal force suitable for intentionally performing a switch operation. Thus, a switch operation can be performed with a small pressing-down force.

It should be noted that the size of the first electrode 11 and the second electrode 12 can be changed as appropriate depending on factors such as the size of a component (door handle, for example) on which the switch device X is installed, and thus there is no limitation to the above-described size.

Furthermore, in this embodiment, when the posture of the first electrode 11 is changed from the first stable posture to the second stable posture due to a switch operation, the capacitance is detected based on a change in the distance (d) between the first electrode 11 and the second electrode 12. Thus, the first electrode 11 is configured so as not to be in contact with the second electrode 12 when the posture thereof is changed from the first stable posture to the second stable posture.

In the switch operation, after the posture has been changed from the first stable posture to the second stable posture, the first electrode 11 is in the second stable posture in which the first electrode 11 is biased to the switch input position. In this state, the switch is kept in the posture of the input position, and thus it is necessary to return the posture to the first stable posture. Thus, an operation member 17 is provided for applying an operation force to the first electrode, thereby returning the posture thereof from the second stable posture to the first stable posture after the posture has been changed from the first stable posture to the second stable posture.

More specifically, as shown in FIG. 3, a hole portion **11*a* is provided in the vicinity of a center of the first electrode 11, and the switch device sealing portion 14*a* is provided with the operation member 17 that passes through the hole portion 11*a* and that has the front end engaged with the first electrode 11**.

As described above, the switch device sealing portion **14*a* is constituted by an elastic material such as rubber, and thus when a finger is removed from the key button 13 after the pressing-down operation in the switch operation of the user, an elastic restoring force returns the switch device sealing portion 14*a* to a flat state as before the pressing-down operation in the switch operation. At that time, the operation member 17 that is provided on the switch device sealing portion 14*a* is also biased to return to the position before the pressing-down operation together with the switch device sealing portion 14*a*. Herein, the front end of the operation member 17 is engaged with the first electrode 11 in the second stable posture, and thus an operation force acts on the first electrode 11 for returning the first electrode 11** to a state before the pressing-down operation in the switch operation, that is, to the first stable posture.

In this manner, the operation member 17 can be used for applying an operation force to the first electrode 11, thereby returning the posture thereof from the second stable posture to the first stable posture. Thus, immediately after the switch operation, the first electrode can return to the input cancellation position in a wait state for a switch operation. At that time, a shock caused when the shape is shifted from a recessed shape to a protruding shape can be felt by the user as a click feel.

Embodiment Variation 1

In the foregoing embodiment, a case was described as an example in which the sensor means is configured so as to be of a capacitance-type for detecting a change in the capacitance between the first electrode 11 and the second electrode 12. In this case, the first electrode 11 is configured so as not to be in contact with the second electrode 12 when the posture is changed from the first stable posture to the second stable posture.

However, in order to make the switch device X compact, for example, it is also possible to apply a configuration in which the first electrode 11 is in contact with the second electrode 12 when the posture is changed from the first stable posture to the second stable posture.

In this case, the sensor means is configured so as to be of a piezoelectric-type for detecting a change in the pressure of the first electrode on the second electrode.

In this case, the second electrode 12 is constituted by a piezoelectric electrode. As the piezoelectric electrode, it is possible to apply a known electrode having a piezoelectric element made of substances such as barium titanate and lead zirconate titanate.

When the posture of the first electrode 11 that is constituted by a plate spring is changed from the first stable posture to the second stable posture in a switch operation, the first electrode 11 is in contact with the second electrode 12. Herein, the voltage of a piezoelectric element that constitutes the piezoelectric electrode changes, and whether or not a switch operation has been performed can be detected by detecting the change in the voltage with a detection circuit (out of the drawings).

Accordingly, when the switch operation is performed in this manner, as described above, the user can feel a click feel accompanying a change in the posture.

Embodiment Variation 2

In the foregoing embodiments, it is also possible to apply a configuration in which an elastic sealing material is held between the switch device sealing portions 14*a* and 14*b*. In this case, as the sealing material, it is possible to apply an O-ring made of rubber, for example. In this case, the signal wire 18 that is connected to the second electrode 12 is linked to an external detection circuit in a state where the signal wire 18 is pressure-bonded with the sealing material. Since the signal wire 18 is pressure-bonded with the sealing material, a rain droplet or the like hardly enters from the outside.

Thus, hardly does a rain droplet, dust, or the like enter the sensor means inside the switch device X even in a poor environment. Accordingly, there is almost no risk of affecting the first or the second electrode in a negative manner, so that a switch operation can be reliably performed.

INDEX TO REFERENCE SYMBOLS

Figure 1:
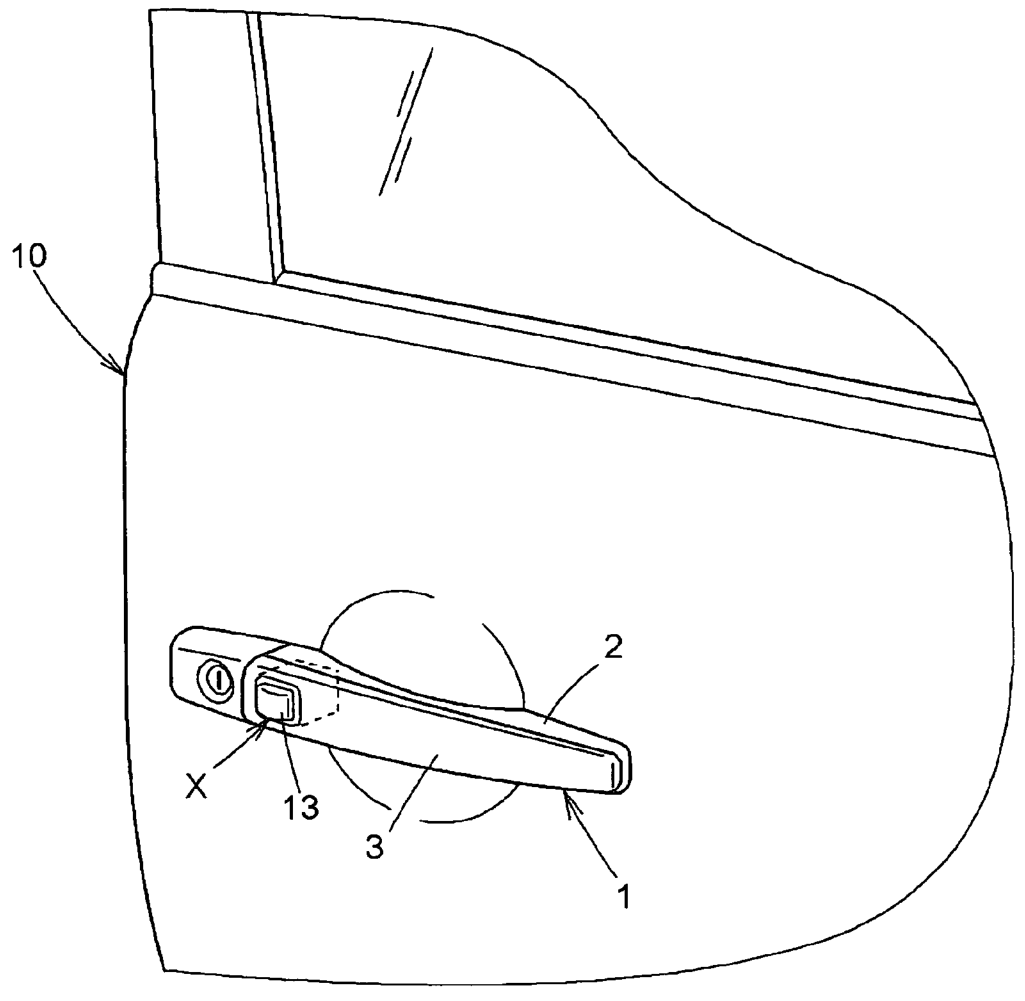
FIG. 1 is a schematic cross-sectional view of a vehicle door handle that is provided with the switch device of the present invention.
Figure 2:
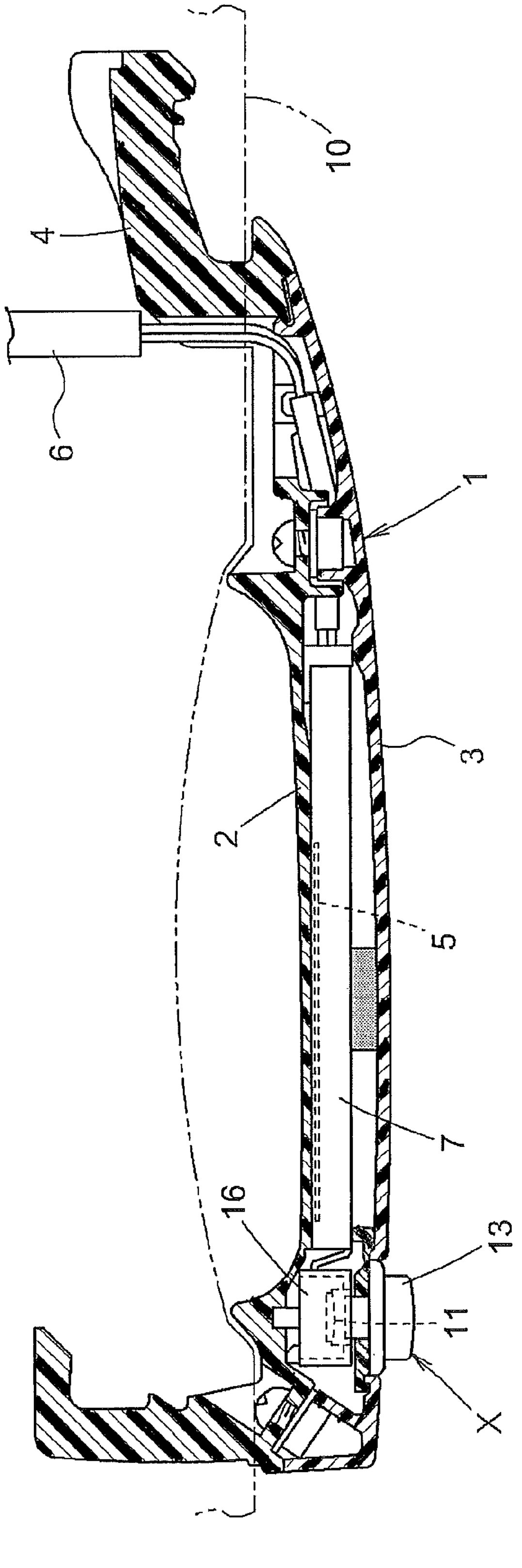
FIG. 2 is a schematic front view of the vehicle door handle that is provided with the switch device of the present invention.
Figure 3:
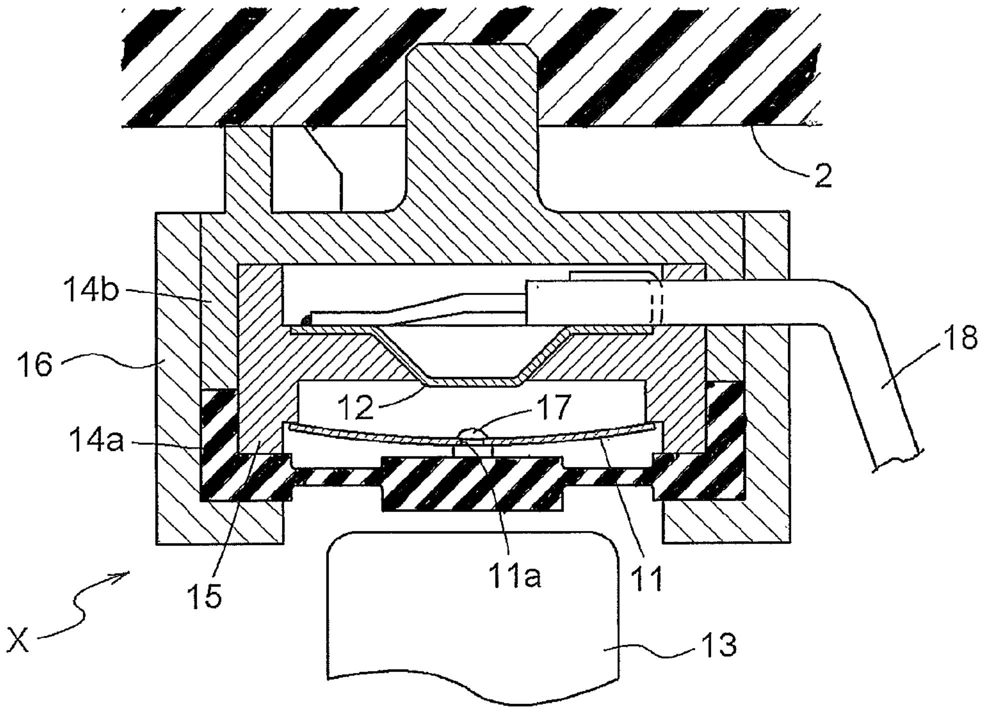
FIG. 3 shows schematic cross-sectional views of the switch device of the present invention, wherein FIG. 3(*a*) shows a first stable posture and FIG. 3(*b*) shows a second stable posture.
Figure 3:
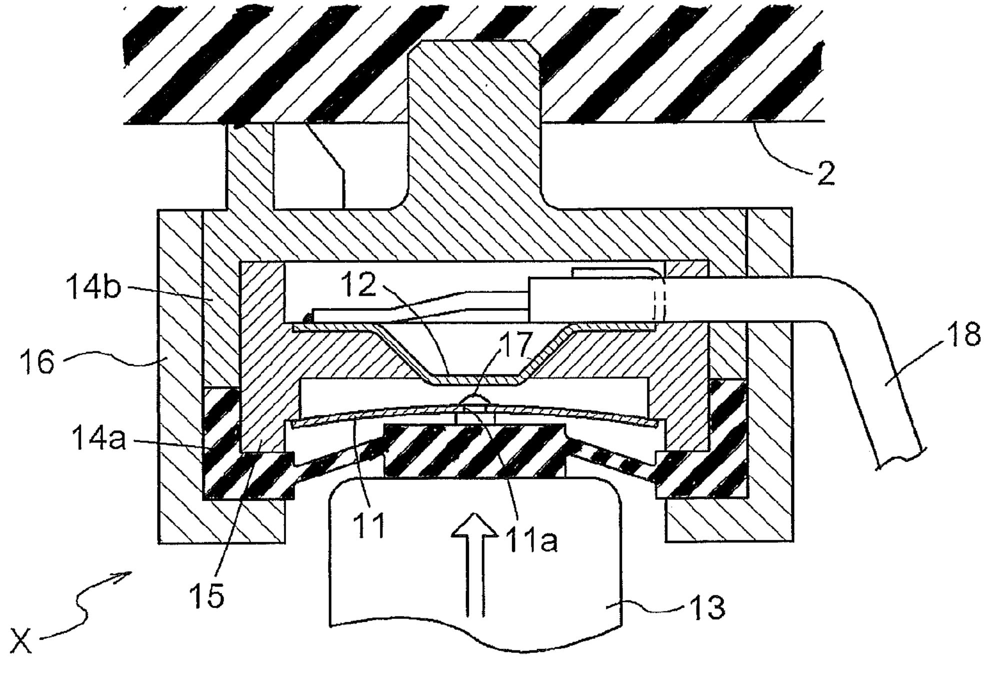

X switch device
11 first electrode
12 second electrode
15 electrode support member
17 operation member

The invention claimed is:

1. A switch device, comprising:

a sensor for sensing an operation input of a user comprising a first electrode and a second electrode opposed to the first electrode, the first electrode including an elastic plate member arranged to be switchable between a first stable posture in which the first electrode is at a switch input cancellation position, and a recessed second stable posture in which the first electrode is at a switch input position;

a switch device external wall portion; and first and second switch device sealing portions arranged inside the switch device external wall portion, the first and second switch device sealing portions bonded together at a joint to form a sealed internal space in which the first and second electrodes are disposed, the joint being covered by the switch device external wall portion;

the first switch device sealing portion being operably connected to the first electrode such that the posture of the first electrode is changed from the first stable posture to the second stable posture when an operation input of a user is applied to the first switch device sealing portion, and such that the first switch device sealing portion applies an elastic restoring force to the first electrode while the first electrode is in the second stable posture;

wherein, after the operation input of a user is released, the posture of the first electrode is returned from the second stable posture to the first stable posture by the elastic restoring force of the first switch device sealing portion.

2. The switch device according to claim 1, wherein the sensor is of a capacitance-type in which a capacitance between the first electrode and the second electrode is changed as a distance therebetween changes.

3. The switch device according to claim 1, wherein the sensor is of a piezoelectric-type for detecting a change in a pressure applied by the first electrode to the second electrode.

4. The switch device according to claim 1, wherein an elastic sealing material is held at the joint between the first and second switch device sealing portions.

5. The switch device according to claim 1, wherein the first switch device sealing portion is connected to the first electrode by an operating member attached to the first switch device sealing portion and extending through the elastic plate member.

6. The switch device according to claim 5, wherein the first and second switch device sealing portions are bonded together by pressure bonding.

7. The switch device according to claim 6, wherein the joint is formed between respective side faces of the first and second switch device sealing portions, which side faces being covered by the switch device external wall portion.

8. The switch device according to claim 1, wherein the elastic plate member is deformable between the first and second postures along a path intersecting the second electrode.

9. The switch device according to claim 8, wherein the first sealing member is elastically deformable along said path.

10. The switch device according to claim 8, further including a button arranged to be manually depressed along said path in a direction for elastically deforming the first sealing member.

* * * * *